United States Patent

[11] 3,555,303

[72] Inventor Tokinori Kozawa
Kokubunji-Shi, Japan
[21] Appl. No. 709,092
[22] Filed Feb. 28, 1968
[45] Patented Jan. 12, 1971
[73] Assignee Hitachi, Ltd.
Chiyoda-ku, Tokyo, Japan
a corporation of Japan
[32] Priority Mar. 1, 1967
[33] Japan
[31] No. 42/12567

[54] FREQUENCY CONVERTER CIRCUIT
5 Claims, 4 Drawing Figs.

[52] U.S. Cl. 307/260, 307/295; 325/438, 325/442: 328/15
[51] Int. Cl. H03k 5/00
[50] Field of Search 307/260, 271, 295; 328/15, 140; 325/430, 435, 436, 438, 442

[56] References Cited

UNITED STATES PATENTS 3,219,934 11/1965 Kalfaian 328/15
3,284,713 11/1966 Bailey 307/295X

*Primary Examiner*—Stanley T. Krawczewicz
*Attorney*—Craig, Antonelli, Stewart & Hill

ABSTRACT: A frequency converter circuit in which the emitters of a pair of transistors are connected to each other to constitute a differential amplifier, said connected emitters being connected to a transistor which amplifies the input signal, one of said pair of transistors being comprised in a local oscillator circuit in which signal is fed back from the collector to the base, and output signal of the converter circuit being derived from the other one of said pair of transistors.

INVENTOR
TOKINORI KOZAWA

BY Craig & Antonelli
ATTORNEYS

INVENTOR

TOKINORI KOZAWA

BY Craig & Antonelli

ATTORNEYS

FREQUENCY CONVERTER CIRCUIT

This invention relates to a frequency converter circuit, particularly to a frequency converter circuit that can be composed as an integrated circuit unit with minimum external circuit elements.

The conventional frequency converter circuits for radio and television receivers are usually composed using fewer active elements and more passive elements from an economical point of view. However, when a frequency converter circuit is to be composed in the form of a integrated circuit, the increase of active elements is not such an acute problem but the increase of passive elements becomes a very important problem in view of the manufacturing process and the increase in size of the complete circuit. Though some passive elements such as resistors and active elements such as transistors can be easily composed within an integrated circuit unit, most passive elements including capacitors and inductors cannot or can hardly be contained in an integrated circuit unit and must be connected to the unit as external elements, thus occupying more space and increasing the steps of the manufacturing process. Therefore, such passive elements should be used as few as possible when an integrated circuit is involved.

An object of this invention is to provide a frequency converter circuit whose operation is substantially stabilized from variations in source voltage and which can be composed in smaller size.

In order to attain the above-mentioned object, the frequency converter circuit of this invention is characterized in that there are provided a pair of transistors connected to each other in a differential amplifier configuration, one of said pair transistors being coupled with a tuning circuit between the collector and the base thereof so as to form a local oscillator, and the other one of the pair transistors being coupled with an intermediate frequency output circuit so as not to be connected with the local oscillator.

Now, the frequency converter circuit of this invention will be explained in detail in comparison with the conventional circuits, and with reference to the attached drawings, in which.

Out of various known frequency converter circuits, the one utilizing a differential amplifier is acknowledged as a circuit which operates with a stable oscillation frequency and provides an intermediate frequency output of stable voltage level. One example of such converter circuits is described in an article entitled "Integrated circuits make a low-cost FM receiver" published in "Electronics" Aug. 8, 1966, pages 133 to 138 and is shown in FIG. 1.

Figure 1:
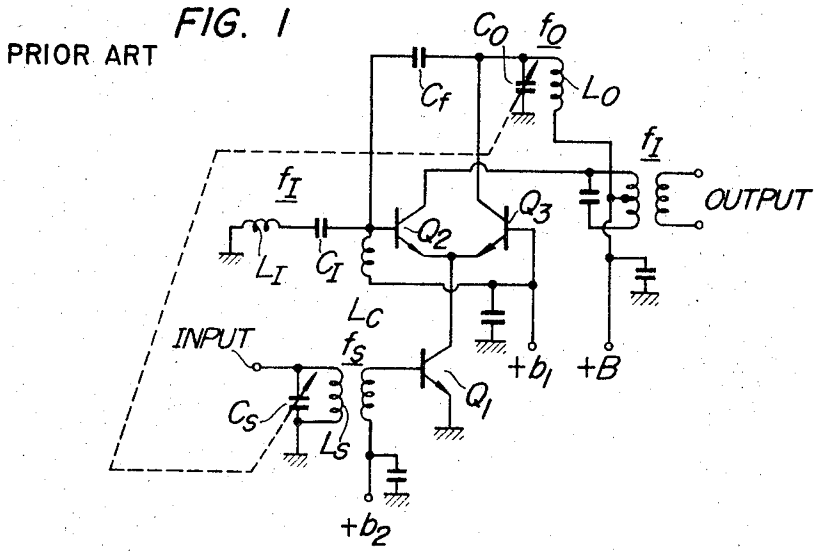
FIG. 1 is an example of the conventional frequency converter circuits intended for an integrated circuit.

In FIG. 1, markings $Q_1$, $Q_2$ and $Q_3$ indicate transistors, $C_S$, $C_I$ $C_o$ and $C_f$ capacitors, and $L_s$, LI $L_O$ and $L_C$ coils; and $f_s$, $f_I$ and $F_O$ are input signal frequency, intermediate frequency and local oscillation frequency, respectively.

The input signal tuned to the parallel resonance circuit which comprises $L_S$ and $C_S$ and is coupled to the base input of the transistor $Q_1$, is amplified by the transistor $Q_l$ and then introduced to the emitters of the transistors $Q_2$and $Q_3$. The transistors $Q_2$and $Q_3$,respective emitters thereof being connected in common, constitute a differential amplifier and at the same time, constitute a local oscillator, the conditions required for the oscillation are established by the positive feedback from the collector of the transistor $Q_3$to the base of the transistor $Q_2$through the capacitor $C_F$. The operating frequency $f_o$of the local oscillator is determined by the valves of the coil $L_o$ and the capacitor $C_o$. The frequency $f_o$ *from the local oscillator and the frequency* $f_S$of the input signal introduced to the emitters of the transistors $Q_2$and $Q_3$, are mixed to produce an output of intermediate frequency $f_I(f_I = f_o - f_S)$ from the collector of the transistor $Q_2$.

A frequency converter circuit of the above-mentioned constitution is not only stable against variation in the source voltage because it involves a differential amplifier, but suffers little interference from the local oscillator to the input because output impedance in the collector of the transistor $Q_1$ is far higher than input impedance in the emitters of the transistors $Q_2$ and $Q_3$.

However, in this converter circuit, the intermediate frequency signal imparts undesirable effects to the local oscillator by the feedback of the signal through base-to-collector capacitance of the transistor $Q_2$, as the load impedance of the transistor $Q_2$is comparatively high. In order to remove these these undesirable effects, an intermediate frequency trap circuit which comprises series connected coil $L_I$ and capacitor $C_I$ and is in series resonance to the intermediate frequency $f_I$, is required for bypassing the intermediate frequency signal to the ground. Further, a base bias for the transistors $Q_2$and $Q_3$must be supplied in such a manner that the potential at the base of the transistor $Q_3$is grounded with respect to AC signal but the potential at the base of the transistor $Q_2$is prevented from being grounded with respect to AC signal by inserting a choke coil $L_C$. Such a need for an intermediate frequency trap circuit and the choke coil is a great obstacle to the formation of an integrated circuit and the overall miniaturization.

Figure 2:
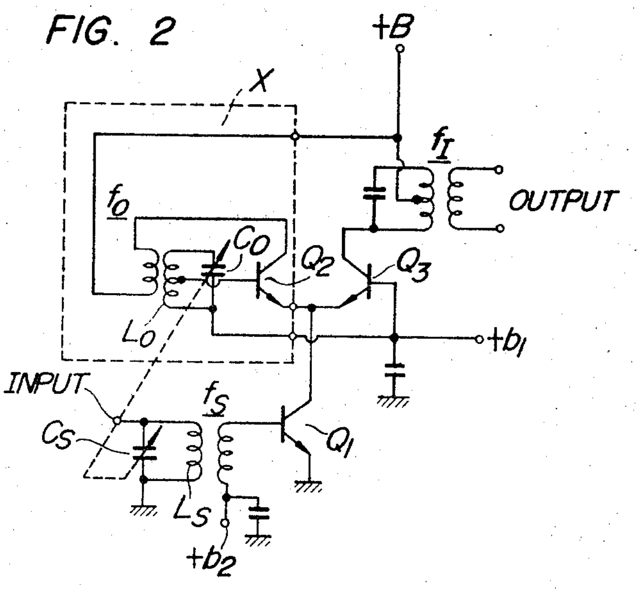
FIG. 2 is a basic circuit of the frequency converter circuit according to this invention.

FIG. 2 is the basic circuit of a frequency converter circuit according to this invention. Elements in FIG. 2 indicated by similar markings correspond to similar elements in FIG. 1. Referring to FIG. 2, input signal (frequency $f_S$) tuned to the parallel resonance circuit which comprises coil $L_S$and capacitor $C_S$and is coupled to the base of transistor $Q_1$, is amplified by the transistor $Q_1$and then introduced to the emitters of the transistors $Q_2$and $Q_3$which constitute a differential amplifier. A local oscillator comprises the transistor $Q_2$and the resonance circuit consisting of the coil $L_o$and a capacitor $C_o$. The base of the transistor $Q_2$is connected to the resonance circuit. The conditions required for the oscillation are established by the feedback from the collector to the base of the transistor $Q_2$through the resonance circuit. On the other hand, as the collector current of transistor $Q_1$is the sum of the emitter currents of transistors $Q_2$and $Q_3$, a constant current circuit is constituted with the aid of the high impedance in the collector output of the transistor $Q_1$, if the DC bias for the transistor $Q_1$is constant. Accordingly, the oscillating current from the transistor $Q_2$is introduced into the emitter of the transistor $Q_3$and then mixed, in the transistor $Q_3$, with the signal current from the collector of the transistor $Q_1$, thereby the output signal of the intermediate frequency $f_I(f_I = f_o - f_S)$ is produced from the collector of the transistor $Q_3$. In FIG. 2, markings $+b_1$ and $+ b_2$ indicate terminals to which base bias voltage sources for the transistors $Q_2$ and $Q_3$ and the transistor $Q_1$ are connected respectively, and the terminal marked +B is for the operating power source. It will be noted that through the bases of the transistors $Q_2$ and $Q_3$ are biased to $+b_1$, the base of the transistor $Q_3$ is grounded with respect to AC signal, while the base of the transitor $Q_2$ is prevented from being grounded by the coil $L_o$ of the resonance circuit.

With the above-described arrangement of the circuit, in which the intermediate frequency signal will not be fed back to the local oscillator circuit, the trap circuit described in connection with FIG. 1 can be eliminated. Further, the choke coil for preventing the base of the transistor $Q_2$ from being grounded with respect to AC signal, can also be omitted owing to the resonance circuit connected to the base. Thus, a more simplified converter circuit is provided according to this invention. Moreover, with the frequency converter circuit of this invention, very high stability of output is assured, for example, the variation in convertion gain being less than 1db. when the voltage of the local oscillation signal is varied in the range of 30 mv. to 300 mv. The electric power gain, with the converter circuit of this invention, is more than 30 db. when the emitter current of the transistor $Q_1$ is 2 ma., the signal input impedance 100 ohms and the load impedance 10 kiloohms.

Figure 3:
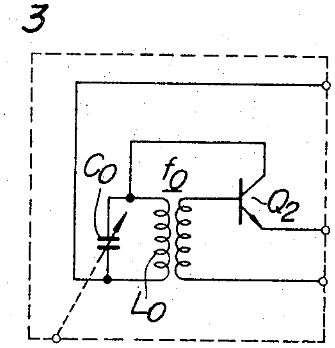
FIG. 3 is an alternative presentation of the essential part in the circuit of this invention.

Though the basic circuit of the frequency converter of this invention has been described hereabove with the resonance circuit connected to the base of the transistor $Q_2$, this invention is not limited to such an arrangement. It will be well understood that the frequency converter circuit may be modified into a circuit as shown in FIG. 3 wherein the resonance circuit is connected to the collector of the transistor $Q_2$ as a substitution for the circuit X shown by dotted line in FIG. 2.

Figure 4:
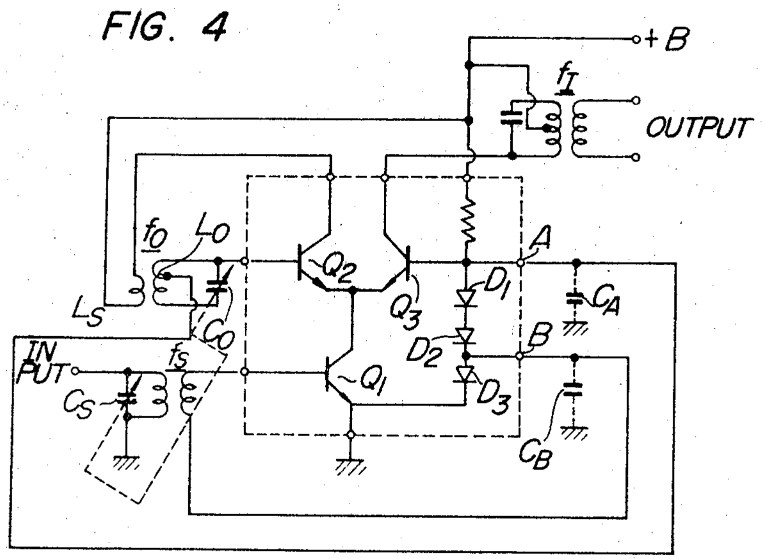
FIG. 4 shows a more practical embodiment of the frequency converter circuit of this invention.

FIG. 4 is a circuit diagram of a more practical embodiment of this invention. Elements in FIG. 4 indicated by similar markings correspond to similar elements in FIG. 2. In FIG. 4, the portion of the circuit within the dash-line enclosure can be fabricated in the form of an integrated circuit. Therefore, the complete frequency converter circuit is composed with very few external elements which are tuning circuit, resonance circuit and intermediate frequency coupling circuit. Markings $D_1$, $D_2$ and $D_3$ indicate diodes which are biased in forward direction by DC power source +B. These three diodes provide a base bias for the transistor $Q_2$ and $Q_3$. This bias voltage (that is, potential at the terminal A) is required to be only sufficiently high to prevent the transistor $Q_1$ from being saturated with the input signal. For example, approximately 2.1 v. is a sufficient value for the bias voltage, corresponding to about three times the forward offset voltage (about 0.7v) of a silicon diode. It will be noted that the potential at the terminal A can be fixed at an appropriate value depending on the number of diodes used in series connection. The diode $D_3$ is used for supplying a bias voltage to the base of the transistor $Q_1$ and concurrently serves as a temperature compensating diode. Thus, this diode $D_3$ which is integrally formed with the transistor $Q_1$ in the same integrated circuit, ensures highly stable operation of the circuit against variations in temperature. As the diodes $D_1$, $D_2$ and $D_3$ are biased in forward direction, the impedance across the diodes is very low so that the terminals A and B can be deemed to be nearly grounded. However, strictly speaking, the diodes have an impedance of scores of ohms, and this impedance causes some loss in gain. To eliminate this loss in gain, the capacitors $C_A$ and $C_B$ are connected to the terminals A and B respectively. The operation of the circuit shown in FIG. 4 is the same as that of the basic circuit shown in FIG. 2, and therefore, will not be described here again.

The frequency converter circuits described heretofore are all equipped with transistors of NPN type. It will be well understood that the circuits could be constituted with similar effects using transistors of PNP type. Further, it will be obvious that the known techniques, such as connection of a resistor to the emitter of the transistor $Q_1$ for expanding the dynamic range of input and connection of resistors to the respective emitters of the transistors $Q_2$ and $Q_3$ for stabilizing the gain of the circuit, can also be applied to the circuit of this invention.

As described above, according to the circuit constitution of this invention which enables to minimize the number of those elements which can hardly be composed in the form of an integrated circuit, an many difficulties and troubles in the manufacturing processes have been eliminated and cost saving has been attained. Moreover, according to this invention, miniaturization of the circuit has been further advanced with far fewer requirements for external elements.

It should be noted that the various embodiments of this invention described heretofore are mere examples and that the scope of this invention will not be limited by those embodiments, various modification being possible according to specific requirements.

I claim:

1. A frequency converter circuit comprising:
   - a first transistor;
   - means for supplying an input signal having a frequency $f_s$ to the base of said first transistor;
   - second and third transistors the emitters of which are connected in common to the collector of said first transistor;
   - a local oscillation frequency resonance circuit turned tuned to a frequency of $f_o$ and coupled between the collector and the base of said second transistor in feed back relation to form a local oscillator; and
   - output means coupled to the collector of said third transistor for obtaining an output signal having a difference frequency between said input signal frequency $f_s$ and said local oscillation frequency $f_o$.

2. A frequency converter circuit according to claim 1, wherein said local oscillation frequency resonance circuit is connected to the base of said second transistor and coupled to the collector thereof.

3. A frequency converter circuit according to claim 1, wherein said local oscillation frequency resonance circuit is connected to the collector of said second transistor and coupled to the base thereof.

4. A frequency converter circuit according to claim 1, wherein a capacitor is connected between the base of said third transistor and ground, whereby the base of said third transistor is grounded with respect to AC signals.

5. A frequency converter circuit according to claim 1, further including means for supplying a DC voltage between the emitter of said first transistor and the collectors of said second and third transistors and for supplying a DC voltage to the bases of said second and third transistors, respectively.